(12) United States Patent
Bills et al.

(10) Patent No.: US 8,358,509 B2
(45) Date of Patent: Jan. 22, 2013

(54) REDUCED WIRING REQUIREMENTS WITH SIGNAL SLOPE MANIPULATION

(75) Inventors: Kevin J. Bills, Austin, TX (US); Mahesh Bohra, Austin, TX (US); Jinwoo Choi, Austin, TX (US); Lloyd A. Walls, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 12/362,649

(22) Filed: Jan. 30, 2009

(65) Prior Publication Data

US 2010/0195756 A1 Aug. 5, 2010

(51) Int. Cl.
*H05K 3/00* (2006.01)

(52) U.S. Cl. ........ 361/777; 375/249; 375/250; 375/257; 375/247; 375/295

(58) Field of Classification Search .................. 361/777; 375/247, 249, 257, 295, 250
See application file for complete search history.

(56) References Cited

U.S. PATENT DOCUMENTS

| 4,000,377 A | 12/1976 | Sharret |
| 4,008,435 A | 2/1977 | Oshima et al. |
| 5,014,284 A | 5/1991 | Langer et al. |
| 5,557,635 A * | 9/1996 | Laird ............................ 375/250 |
| 5,828,270 A | 10/1998 | Chang |
| 7,813,566 B2 * | 10/2010 | Sekiguchi et al. ............ 382/232 |
| 2005/0175118 A1 | 8/2005 | Bergler |
| 2006/0216040 A1 | 9/2006 | Nelson |

* cited by examiner

*Primary Examiner* — Tuan T Dinh
*Assistant Examiner* — Hung Dang
(74) *Attorney, Agent, or Firm* — Suiter Swantz pc llo

(57) ABSTRACT

An information handling system device includes a plurality of electronic components; an electric circuit including at least one trace for connecting two or more of the plurality of electronic components and transmitting data between the plurality of electronic components via at least one electric signal; and a substrate including an insulating material for serving as a base for the electric circuit and the plurality of electronic components, wherein the at least one electric signal transmitted between the plurality of electronic components is transmitted utilizing slope manipulation to provide a slope directly proportional to a data value.

29 Claims, 5 Drawing Sheets

US 8,358,509 B2

REDUCED WIRING REQUIREMENTS WITH SIGNAL SLOPE MANIPULATION

TECHNICAL FIELD

The present disclosure generally relates to the field of printed circuit boards, and more particularly to a system, method, and apparatus for reducing the number of traces on a printed circuit board.

BACKGROUND

As data transfer rates steadily increase, more exotic and expensive methodologies are introduced into modules and printed circuit boards. One such technique includes adding pre-emphasis stages to the drivers of modules to improve channel performance. Another technique includes utilizing differential signals for improving signal integrity. However, pre-emphasis circuits add complexity and power requirements to the modules, and differential signals may require twice the routing space required by single-ended signals. Thus, both techniques may increase system performance, but they may also increase the cost of the system as well. It would be desirable to boost system performance while lowering overall cost.

SUMMARY

An information handling system device includes a plurality of electronic components; an electric circuit including at least one trace for connecting two or more of the plurality of electronic components and transmitting data between the plurality of electronic components via at least one electric signal; and a substrate including an insulating material for serving as a base for the electric circuit and the plurality of electronic components, wherein the at least one electric signal transmitted between the plurality of electronic components is transmitted utilizing slope manipulation to provide a slope directly proportional to a data value.

A method includes supporting an electric circuit and a plurality of electronic components on a substrate including an insulating material; connecting two or more of the plurality of electronic components with the electric circuit; and transmitting data between the plurality of electronic components via at least one electric signal utilizing slope manipulation to provide a slope directly proportional to a data value.

A system includes a means for connecting two or more of a plurality of electronic components; a means for transmitting data between the plurality of electronic components via at least one electric signal; and a means for supporting the plurality of electronic components, wherein the at least one electric signal transmitted between the plurality of electronic components is transmitted utilizing slope manipulation to provide a slope directly proportional to a data value.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
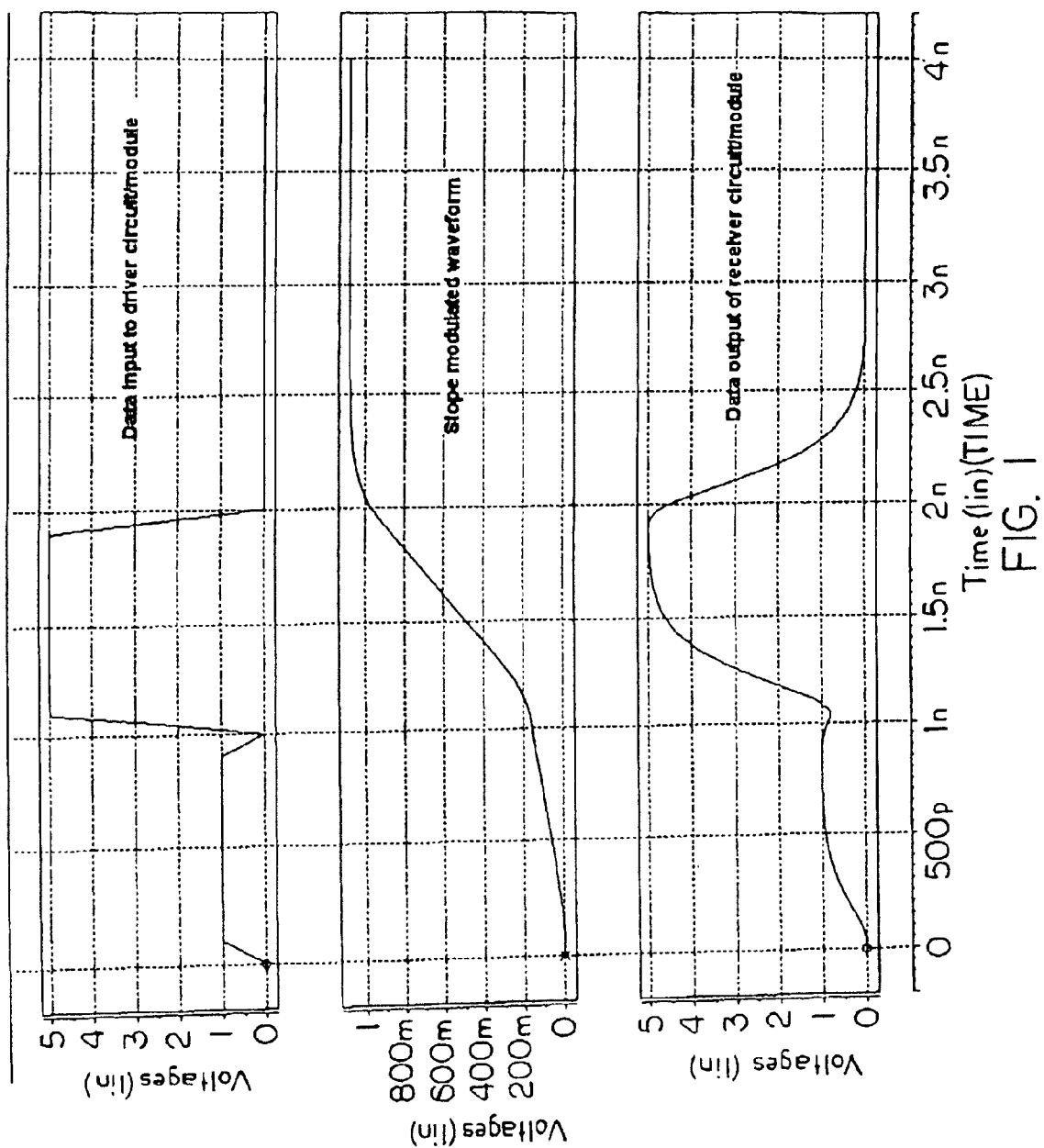
FIG. 1 is a model illustrating an input into an ideal integrator (top), a slope manipulated signal transmitted from the ideal integrator to an ideal differentiator (middle), and an output of the ideal differentiator (bottom), where the output of the integrator is connected directly to the input of the differentiator.
Figure 2:
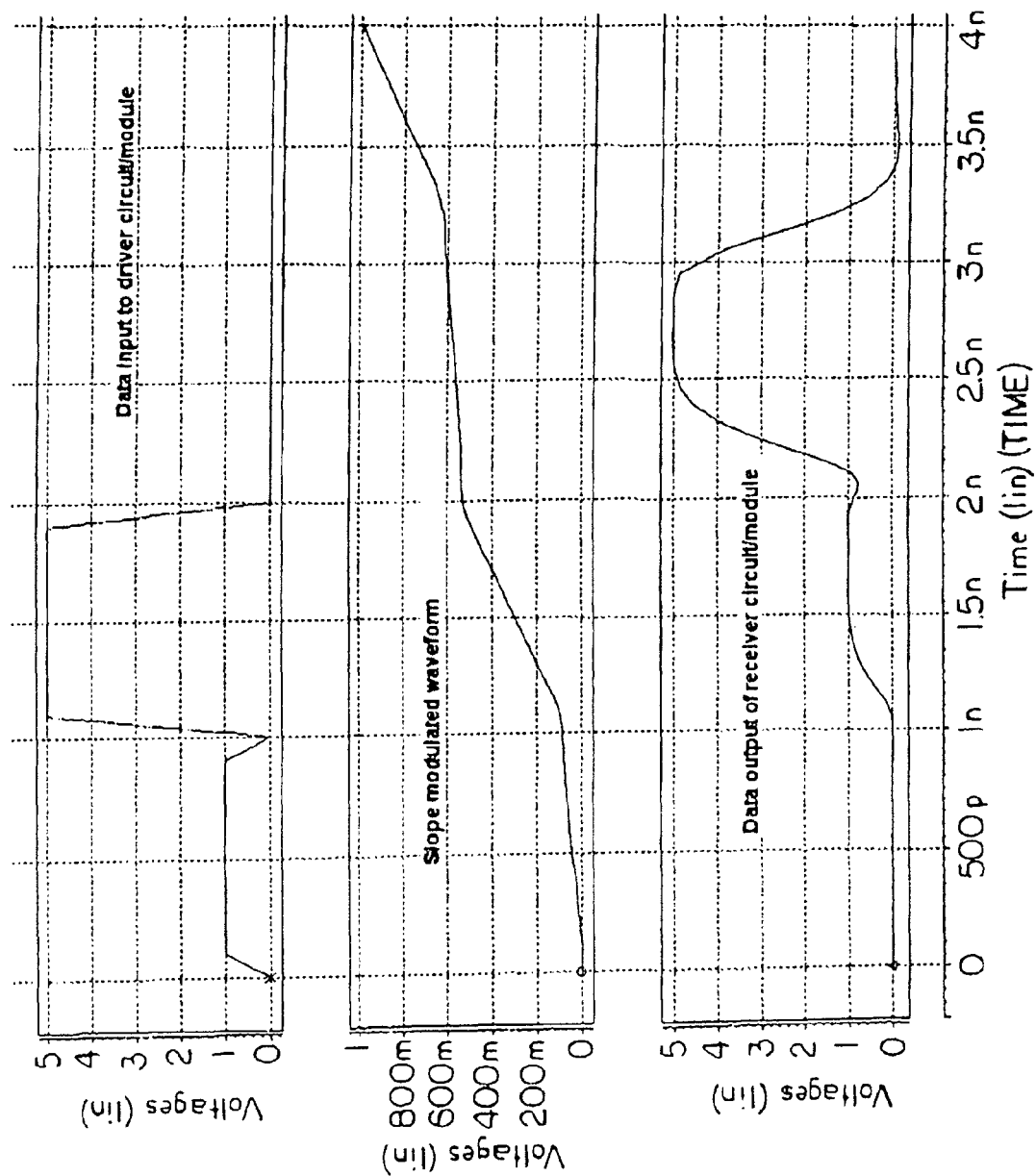
FIG. 2 is a model illustrating an input, a slope manipulated signal, and an output utilizing the same ideal components as shown in FIG. 1, where a 5-inch trace connects the driver of the source circuit/module (the ideal integrator, top) to the receiver of the destination circuit/module (the ideal differentiator, bottom), and where a slope manipulated signal is transmitted from the driver to the receiver (middle)
Figure 3:
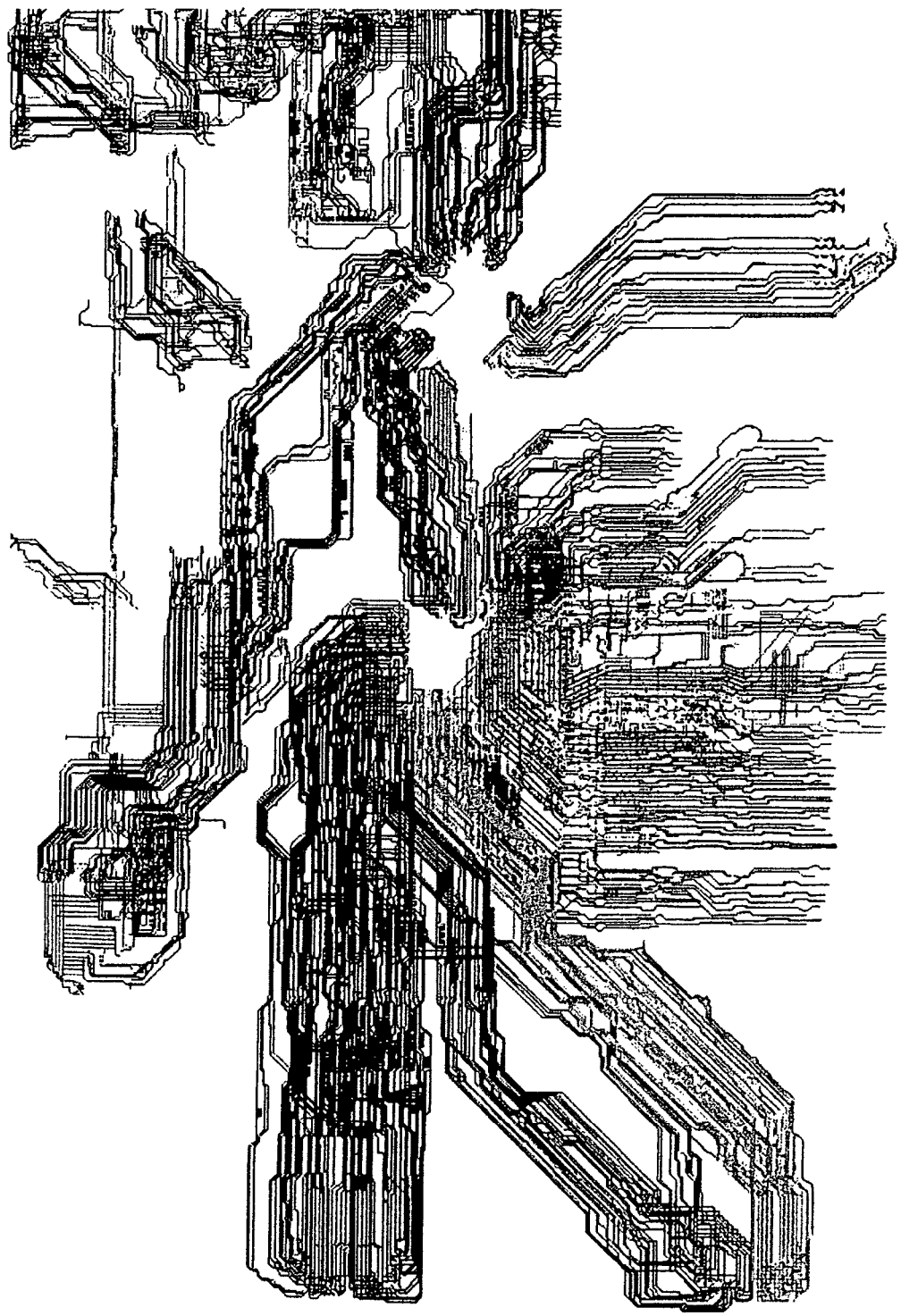
FIG. 3 is a schematic illustrating card routing for a number of multi-bit bus circuit traces, where data is transmitted in a digital form.
Figure 4:
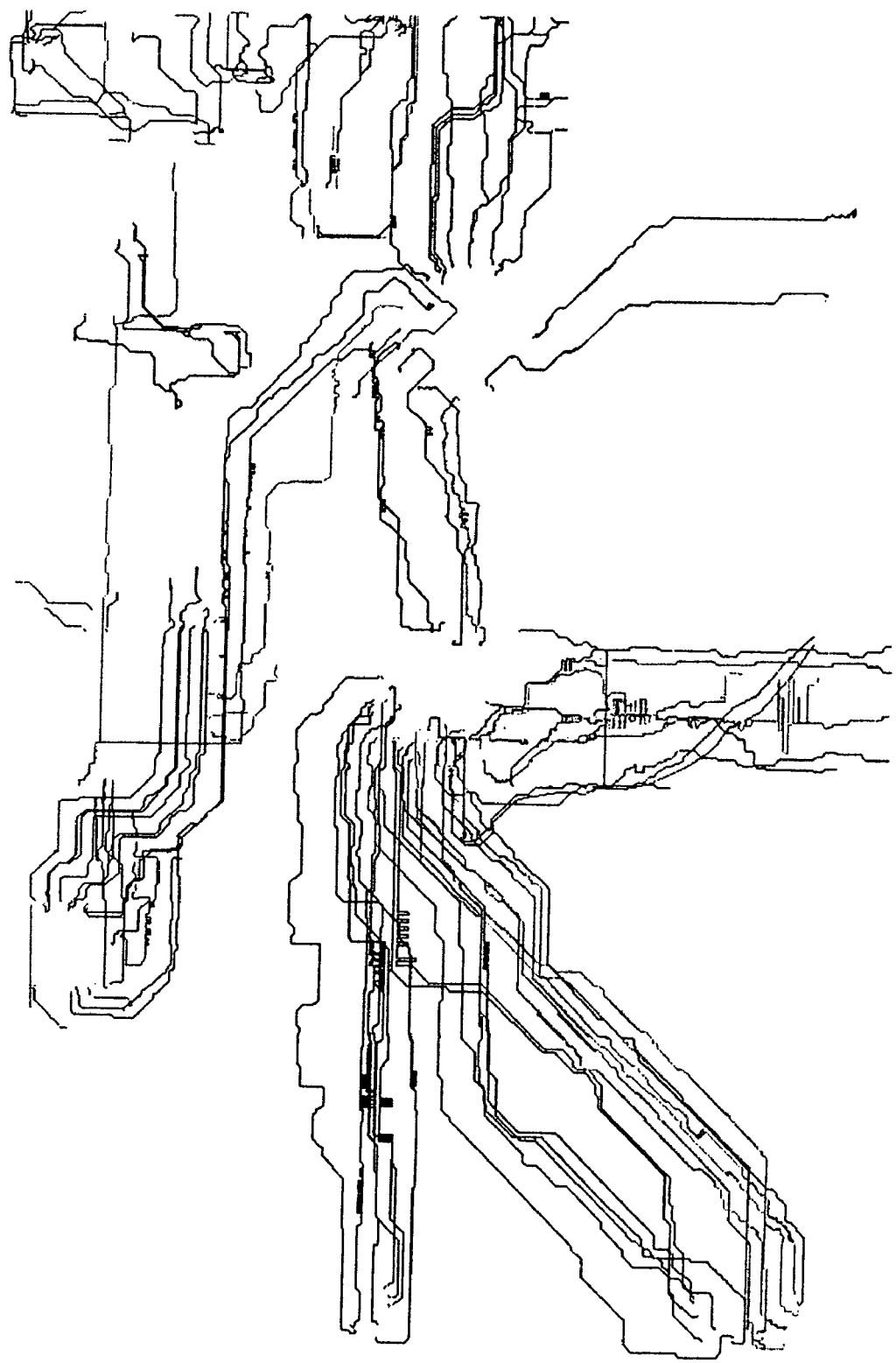
FIG. 4 is a schematic of the same multi-bit bus card routing as illustrated in FIG. 3, where slope modulation is utilized to reduce the number of traces.

Examples of slope modulation are illustrated in FIGS. 1 and 2. FIG. 1 is a model illustrating an input into an ideal integrator (top), a slope manipulated signal transmitted from the ideal integrator to an ideal differentiator (middle), and an output of the ideal differentiator (bottom), where the output of the integrator is connected directly to the input of the differentiator. FIG. 2 is a model illustrating an input, a slope manipulated signal, and an output utilizing the same ideal components as shown in FIG. 1, where a 5-inch trace connects the driver of the source circuit/module (the ideal integrator, top) to the receiver of the destination circuit/module (the ideal differentiator, bottom), and where a slope manipulated signal is transmitted from the driver to the receiver (middle). It should be noted that in FIG. 2, the output is offset in time due to the time of flight through the wire. (Additionally, parasitic characteristics of the wire may cause the slight offset on the back end of the output trace.)

FIGS. 1 and 2 illustrate the transmission of two data values, namely one and five. In these figures, it can be seen how slope modulation may be utilized to drive an analog signal through an electric circuit, where the analog signal can represent discrete integer values. For the purposes of the present disclosure, slope modulation may be defined as modulating a waveform such that the slope of the manipulated signal is directly proportional to the value of the incident data provided to the source circuit/module. For example, in FIG. 1, the value of one is transmitted from a driver circuit/module to a receiver circuit/module over a first nanosecond utilizing slope manipulation to create a slope modulated waveform from which the value of one may determined (e.g., by examining a slope of the waveform during the first nanosecond).

Similarly, the value of five is transmitted over a second nanosecond utilizing slope manipulation to create a slope modulated waveform from which the value of five may determined (e.g., by examining a slope of the waveform during the second nanosecond). As previously described, a slope of the signal transmitted during the first nanosecond is directly proportional to the value of one, while a slope of the signal transmitted during the second nanosecond is directly proportional to the value of five. It will be appreciated that time delays may be associated with the data transmission (as shown in FIG. 2). However, regardless of the speed of transmission and/or any associated time delays, data may be gathered from the received signal by calculating the slope of the transmitted data, as previously discussed.

Figure 5:
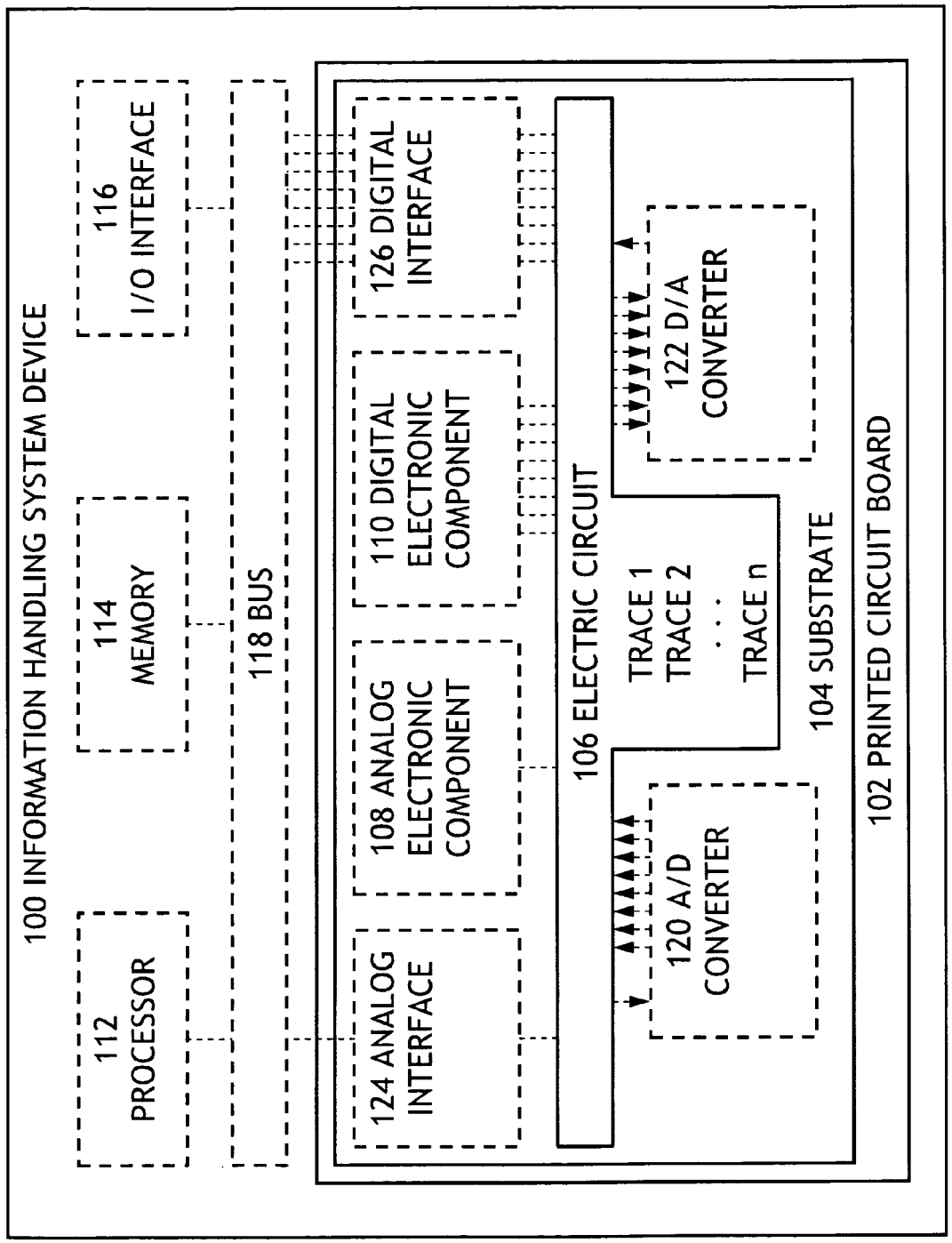
FIG. 5 is a block diagram illustrating an information handling system device in accordance with the present disclosure.

Referring now to FIG. 5, an information handling system device 100 is described in accordance with the present disclosure. The information handling system device 100 may comprise any type of electronic device having the ability to store, retrieve, and/or process data (e.g., a desktop computer, a laptop computer, and/or a server). The information handling system device 100 may include one or more thin boards of insulating material (e.g., fiberglass impregnated with epoxy resin, paper impregnated with phenolic resin, plastic, polyimide film, silicon, and materials including copper or aluminum cores) that serve as the base for a printed circuit, i.e., a pattern of connections, or traces, superimposed (printed) onto a non-conductive substrate. For example, in one embodiment, the information handling system device 100 includes a printed circuit board 102 having one or more electric circuits connecting one or more electronic components.

The printed circuit board 102 includes a substrate 104 with an electric circuit 106 superimposed thereupon. The electric circuit 106 may include connections formed of metal strips (e.g., copper) comprising a conductive pathway in a pattern typically produced utilizing silk screen printing, photoengraving, PCB Milling, and/or electroplating. For instance, the electric circuit 106 may include traces etched from a copper sheet and laminated onto the substrate 104. Electronic components, such as an analog electronic component 108 and/or a digital electronic component 110, may be fixed to the substrate 104 and connected to the electric circuit 106 with solder. Component leads and integrated circuit pins may pass through holes (vias) in the board, or, alternatively, they may be surface mounted. The printed circuit board 102 may include components mounted on one or both sides, as well as internal signal layers, which allow more connections within the same board area.

The analog electronic component 108 and/or the digital electronic component 110 may comprise processing units, memory, specialized microchips, fans, input/output ports, and the like. In some embodiments, the printed circuit board 102 may add functionality to the information handling system device 100. For example, the information handling system device 100 may include a processor 112, a memory 114, and an I/O interface 116. The printed circuit board 102 may be interconnected with the processor 112, the memory 114, and/or the I/O interface 116 via a bus 118. Additionally, the printed circuit board 102 may include a port for connecting an external device (e.g., a printer, a monitor, an external disk drive) to the information handling system device 100. In this configuration, the printed circuit board 102 may be utilized for controlling data exchanged between the external device and the information handling system device 100.

In a configuration where the information handling system device 100 comprises a desktop Personal Computer (PC), a primary circuit board may include a mainboard/motherboard (e.g., a printed circuit board including a Central Processing Unit (CPU), one or more buses, memory sockets, and/or expansion slots). In one embodiment, the printed circuit board 102 may comprise the mainboard/motherboard. In another embodiment, the printed circuit board 102 may be connected to a component of the information handling system device 100 (e.g., the primary circuit board) via an expansion slot. In other embodiments, the printed circuit board 102 may be connected to a component of the information handling system device 100 via a direct/soldered connection, while in still further embodiments, the printed circuit board 102 may be wirelessly connected to a component of the information handling system device 100.

The electric circuit 106 may be utilized to connect a number of different electronic components, including the analog electronic component 108 and the digital electronic component 110. The analog electronic component 108 may receive and/or transmit data via the electric circuit 106 in analog form, while the digital electronic component 110 may receive and/or transmit data in digital form. An analog to digital (A/D) converter 120 may be coupled between a first trace of the electric circuit 106 and the digital electronic component 110. The A/D converter 120 may be utilized for converting an analog signal transmitted along the first trace (e.g., from the analog electronic component 108) into a digital signal, which may then be transmitted along a number of separate traces to the digital electronic component 110.

A digital to analog (D/A) converter 122 may be coupled between a first trace of the electric circuit 106 and the digital electronic component 110. The D/A converter 122 may be utilized for converting a digital signal transmitted along a number of separate traces from the digital electronic component 110 into an analog signal, which may then be transmitted along the first trace (e.g., to the analog electronic component 108). It is further contemplated that the information handling system device 100 may include an analog interface 124 for transmitting information to and/or from the information handling system device 100 in analog form. Also, the information handling system device 100 may include a digital interface 126 for transmitting information to and/or from the information handling system device 100 in digital form.

In one embodiment, slope modulation is utilized for transferring data comprising integer data values ranging from zero to 255 on the printed circuit board 102. Each integer data value may be encoded into a single slope and transmitted along a single circuit board trace. Encoding integer data values in this manner may provide an eight-to-one reduction in the number of circuit board traces required for a printed circuit board when compared to transmitting the same amount of data in bit (binary digit) form. For instance, one circuit board trace transmitting integer data values ranging from zero to 255 may be capable of transmitting the same amount of data as eight circuit board traces where each circuit board trace transmits a single bit ($2^8=256$). Thus, transmitting data utilizing slope modulation in accordance with the present disclosure may reduce the cost of manufacturing printed circuit boards and/or reduce cross-talk by widening the spacing between circuit board traces.

Returning now to the present example, 256 different slopes are required to represent the integer data values ranging from zero to 255. In this example, in order to provide 256 distinct slopes with moderate granularity to account for noise, each one of the 256 different slopes may be transmitted utilizing reference voltages ranging from −12.8 volts to +12.8 volts. These reference voltages would allow for at least approximately 100 millivolts between each value (+12.8 volts−−12.8 volts=25.6 volts; 25.6 volts/256 slopes=0.1 volts/slope=100 millivolts/slope). It will be appreciated that for each bit increase (i.e., for each additional circuit board trace to be combined into a single circuit board trace), the number of distinct slopes required doubles, and the reference voltages required may increase as well (e.g., in order to maintain moderate granularity to account for noise).

For instance, if an additional bit's worth of data were transferred along the single circuit board trace of the present example (i.e., in a configuration where a single circuit board trace transmits the same amount of data as nine circuit board traces each transmitting a single bit), 512 distinct slopes would be required ($2^9=512$). Additionally, reference voltages ranging from −25.6 volts to +25.6 volts would be required to achieve the same granularity as previously described (+25.6 volts−−25.6 volts=51.2 volts; 51.2 volts/512 slopes=0.1 volts/slope=100 millivolts/slope).

While the previous two examples illustrate the transmission of eight and nine bits' worth of data along a single circuit board trace, these examples are meant to be illustrative of the present disclosure and not restrictive thereof. Indeed, this technique could potentially be utilized to represent any number of bits per trace. However, since the data in computers is presently manipulated in modules as binary data and stored in bytes, it is contemplated that 2-bit, 4-bit and 8-bit representations of data may be the most useful (at least with present computing architectures). It should be noted that this discussion is merely contemplative and is not meant to preclude or steer away from the use of other bit representations in combination with any current and/or future computing architectures.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An information handling system device, comprising:
   a plurality of electronic components;
   an electric circuit including at least one trace for connecting two or more of the plurality of electronic components and transmitting data between the plurality of electronic components via at least one electric signal; and
   a substrate including an insulating material for serving as a base for the electric circuit and the plurality of electronic components,
   wherein the at least one electric signal transmitted between the plurality of electronic components is transmitted utilizing slope manipulation by manipulating the at least one electric signal to provide a slope directly proportional to a discrete integer data value, the discrete integer data value being an n-bit data value, n being a positive integer greater than or equal to 4, said discrete integer data value represented by using one of $2^n$ distinct slopes, said $2^n$ distinct slopes being transmitted utilizing a particular reference voltage of $2^n$ reference voltages for each of said $2^n$ distinct slopes, with approximately 0.1 volts between each reference voltage.

2. The information handling system device of claim 1, further comprising:
   an analog to digital (A/D) converter coupled between the at least one trace and a digital electronic component of the plurality of electronic components for converting the at least one electric signal transmitted utilizing slope manipulation to a digital signal for receipt by the digital electronic component.

3. The information handling system device of claim 1, further comprising:
   a digital to analog (D/A) converter coupled between the at least one trace and a digital electronic component of the plurality of electronic components for converting a digital signal transmitted by the digital electronic component to the at least one electric signal utilizing slope manipulation.

4. The information handling system device of claim 1, wherein at least one of the two or more of the plurality of electronic components connected by the at least one trace comprises an analog electronic component.

5. The information handling system device of claim 1, further comprising:
   an analog interface for transmitting information at least one of to or from the information handling system device utilizing slope manipulation.

6. The information handling system device of claim 1, further comprising:
   a digital interface for transmitting information at least one of to or from the information handling system device in digital form.

7. The information handling system device of claim 1, wherein the discrete integer data value is an 8-bit data value represented by using one of 256 distinct slopes, said 256 distinct slopes being transmitted utilizing a particular reference voltage of 256 reference voltages for each of said 256 distinct slopes, said 256 reference voltages ranging from −12.8 volts to +12.8 volts with approximately 0.1 volts between each reference voltage.

8. The information handling system device of claim 1, wherein the substrate is a circuit board.

9. The information handling system device of claim 1, wherein the electric circuit comprises a conductive pathway.

10. The information handling system device of claim 9, wherein the conductive pathway comprises copper.

11. The information handling system device of claim 9, wherein the conductive pathway is produced through at least one of printing, photoengraving, milling, etching, or electroplating.

12. The information handling system device of claim 1, wherein at least one of the plurality of electronic components is fixed to the substrate.

13. The information handling system device of claim 1, wherein at least one of the plurality of electronic components is mounted to the substrate.

14. The information handling system device of claim 1, wherein the substrate further includes at least one internal signal layer.

15. The information handling system device of claim 1, wherein the plurality of electronic components are mounted on or fixed to one or both sides of the substrate.

16. The information handling system device of claim 1, wherein the substrate includes at least one hole.

17. The information handling system device of claim 1, wherein the substrate is wirelessly connected to a component of the information handling device.

18. The information handling system device of claim 1, wherein the substrate includes at least one of fiberglass impregnated with epoxy resin, paper impregnated with phenolic resin, plastic, polyimide film, silicon, a material with an aluminum core, or a material with a copper core.

19. The information handling system device of claim 1, wherein the discrete integer data value is a 9-bit data value represented by using one of 512 distinct slopes, said 512 distinct slopes being transmitted utilizing a particular reference voltage of 512 reference voltages for each of said 512 distinct slopes, said 512 reference voltages ranging from −25.6 volts to +25.6 volts with approximately 0.1 volts between each reference voltage.

20. The information handling system device of claim 1, wherein the plurality of electronic components includes at least one of one or more processors, one or more buses, one or more memory sockets, or one or more expansion slots.

21. A method, comprising:
supporting an electric circuit and a plurality of electronic components on a substrate including an insulating material;
connecting two or more of the plurality of electronic components with the electric circuit; and
transmitting data between the plurality of electronic components via at least one electric signal utilizing slope manipulation by manipulating the at least one electric signal to provide a slope directly proportional to a discrete integer data value, the discrete integer data value being an n-bit data value, n being a positive integer greater than or equal to 4, said discrete integer data value represented by using one of $2^n$ distinct slopes, said $2^n$ distinct slopes being transmitted utilizing a particular reference voltage of $2^n$ reference voltages for each of said $2^n$ distinct slopes, with approximately 0.1 volts between each reference voltage.

22. The method of claim 21, further comprising:
coupling an analog to digital (A/D) converter between the electric circuit and a digital electronic component of the plurality of electronic components; and
converting the at least one electric signal transmitted utilizing slope manipulation to a digital signal for receipt by the digital electronic component.

23. The method of claim 21, further comprising:
coupling a digital to analog (D/A) converter between the electric circuit and a digital electronic component of the plurality of electronic components; and
converting a digital signal transmitted by the digital electronic component to the at least one electric signal utilizing slope manipulation.

24. The method of claim 21, wherein at least one of the two or more of the plurality of electronic components comprises an analog electronic component.

25. The method of claim 21 further comprising:
transmitting information at least one of to or from an information handling system device utilizing slope manipulation.

26. The method of claim 21, further comprising:
transmitting information at least one of to or from an information handling system device in digital form.

27. A system, comprising:
means for connecting two or more of a plurality of electronic components;
means for transmitting data between the plurality of electronic components via at least one electric signal; and
means for supporting the connecting means and the plurality of electronic components,
wherein the at least one electric signal transmitted between the plurality of electronic components is transmitted utilizing slope manipulation by manipulating the at least one electric signal to provide a slope directly proportional to a discrete integer data value, the discrete integer data value being an n-bit data value, n being a positive integer greater than or equal to 4, said $2^n$ distinct slopes being transmitted utilizing a particular reference voltage of $2^n$ reference voltages for each of said $2^n$ distinct slopes, with approximately 0.1 volts between each reference voltage.

28. The system of claim 27, further comprising:
means, coupled between the at least one trace and a digital electronic component of the plurality of electronic components, for converting the at least one electric signal transmitted utilizing slope manipulation to a digital signal for receipt by the digital electronic component; and
means, coupled between the at least one trace and a digital electronic component of the plurality of electronic components, for converting a digital signal transmitted by the digital electronic component to the at least one electric signal utilizing slope manipulation,
wherein at least one of the two or more of the plurality of electronic components comprises an analog electronic component.

29. The system of claim 27, further comprising:
means for transmitting information at least one of to or from the information handling system device utilizing slope manipulation.

* * * * *